United States Patent
Takahashi et al.

(10) Patent No.: US 10,431,884 B2
(45) Date of Patent: Oct. 1, 2019

(54) RADAR COVER AND METHOD OF MANUFACTURING RADAR COVER

(71) Applicant: FALTEC Co., Ltd., Kawasaki-shi (JP)

(72) Inventors: Masakazu Takahashi, Kawasaki (JP); Koushirou Oota, Kawasaki (JP)

(73) Assignee: FALTEC CO. LTD., Kawasaki-Shi (JP)

( * ) Notice: Subject to any disclaimer, the term of this patent is extended or adjusted under 35 U.S.C. 154(b) by 0 days.

(21) Appl. No.: 15/714,367

(22) Filed: Sep. 25, 2017

(65) Prior Publication Data
US 2018/0090832 A1    Mar. 29, 2018

(30) Foreign Application Priority Data

Sep. 27, 2016 (JP) ................................. 2016-188022

(51) Int. Cl.
*H01Q 1/42* (2006.01)
*B60R 13/00* (2006.01)
(Continued)

(52) U.S. Cl.
CPC ............. *H01Q 1/42* (2013.01); *B60R 13/005* (2013.01); *C23C 14/205* (2013.01); *C23C 14/34* (2013.01); *G01S 13/931* (2013.01); *H01Q 1/3233* (2013.01); *B44C 5/0453* (2013.01); *B44F 1/045* (2013.01); *B60R 19/52* (2013.01); *B60R 2019/525* (2013.01); *G01S 7/02* (2013.01); *G01S 2007/027* (2013.01); *G01S 2013/9375* (2013.01); *H01Q 1/3283* (2013.01); *H01Q 1/422* (2013.01)

(58) Field of Classification Search
CPC ...... H01Q 1/3233; H01Q 1/42; B60R 13/005; C23C 14/205; C23C 14/34; G01S 13/931
See application file for complete search history.

(56) References Cited

U.S. PATENT DOCUMENTS 5,103,241 A    4/1992  Wu
2004/0125023 A1*  7/2004  Fujii ................... B29C 45/1671
                                              343/700 MS
(Continued)

FOREIGN PATENT DOCUMENTS

EP    2293382 A1    3/2011
JP    2010066152 A  3/2010
JP    2011046183 A  3/2011

OTHER PUBLICATIONS

Yamamoto et al., "EM-Wave Transmission Characteristic of Periodically Perforated Metal Plates", IEEE 5th Asia-Pacific Conference on Antennas and Propagation (APCAP), pp. 7-8, Jul. 26, 2016.
(Continued)

*Primary Examiner* — Dieu Hien T Duong
(74) *Attorney, Agent, or Firm* — Moser Taboada

(57) ABSTRACT

A radar cover for covering a radar unit which detects a situation around a vehicle, includes: a base portion which serves as a frame; a bright layer which is formed on a surface of the base portion and is a discontinuous metal layer having openings penetrating therethrough in a layer thickness direction; and a transparent top coat layer formed on a surface of the bright layer, parts of the top coat layer being in close contact with the base portion through the openings of the bright layer.

6 Claims, 5 Drawing Sheets

(51) Int. Cl.
*G01S 13/93* (2006.01)
*H01Q 1/32* (2006.01)
*C23C 14/20* (2006.01)
*C23C 14/34* (2006.01)
*B60R 19/52* (2006.01)
*G01S 7/02* (2006.01)
*B44C 5/04* (2006.01)
*B44F 1/04* (2006.01)

(56) References Cited

U.S. PATENT DOCUMENTS

2007/0115167 A1 5/2007 Fujii et al.
2011/0047784 A1* 3/2011 Ohtake ............... H01Q 1/42
          29/600
2018/0254551 A1* 9/2018 Guretzky ............ B60R 13/005

OTHER PUBLICATIONS

Supplementary European Search Report dated Mar. 1, 2018 for Application No. 17192372.5.

* cited by examiner

RADAR COVER AND METHOD OF MANUFACTURING RADAR COVER

CROSS-REFERENCE TO RELATED APPLICATIONS

This application claims priority to and the benefit of Japanese Patent Application No. 2016-188022, filed on Sep. 27, 2016, the disclosure of which is incorporated herein by reference in its entirety.

BACKGROUND

Field of the Invention

The present invention relates to a radar cover and a method of manufacturing a radar cover.

Description of the Related Art

In recent years, radar units for detecting obstacles or the like around a vehicle using electromagnetic waves such as millimeter waves or the like have been mounted on vehicles. Such a radar unit is disposed on an inner side of a radiator grille or an emblem provided on a front surface of a vehicle, and transmits and receives electromagnetic waves through the emblem or the like. Therefore, in a vehicle having such a radar unit as described above, it is necessary for the emblem or the like to be formed to be capable of transmitting electromagnetic waves while suppressing attenuation of the electromagnetic waves.

On the other hand, since the emblem or the like is disposed on the front side of a vehicle, it is very important part in a design perspective of the vehicle, and metallic brilliance is often provided in the emblem or the like to improve luxuriousness or texture. Conventionally, plating treatment is generally applied to provide such metallic brilliance, but it is difficult to transmit electromagnetic waves in plated layers. Therefore, in recent years, a technology of forming a thin film of indium (In) or aluminum (Al) through which electromagnetic waves can be transmitted by vacuum deposition has been used to provide metallic brilliance and allow transmission of electromagnetic waves (see Japanese Unexamined Patent, First Application Publication No. 2011-46183).

Meanwhile, conventionally, the thin film (hereinafter referred to as a bright layer) of indium (In) or aluminum (Al) is formed on a base coat layer formed on a surface of a base portion of a rigid member (a strength member) which serves as a frame. Further, a top coat layer is formed on the bright layer. That is, in the conventional radar cover, the bright layer is disposed on the surface of the base portion serving as a frame in a state in which it is sandwiched between the base coat layer and the top coat layer. However, when such a configuration is employed, a process of forming the base coat layer and a process of forming the top coat layer are required separately from a process of forming the bright layer, and therefore the process of manufacturing the radar cover becomes complicated.

The present invention has been made in view of the above-described problem and an objective of the present invention is to simplify the manufacturing process in a radar cover having a bright layer that can transmit electromagnetic waves.

SUMMARY

The present invention employs the following configuration as means for solving the problems described above.

A first aspect of the present invention is a radar cover for covering a radar unit which detects a situation around a vehicle, including: a base portion which serves as a frame; a bright layer which is formed on a surface of the base portion and is a discontinuous metal layer having openings penetrating therethrough in a layer thickness direction; and a transparent top coat layer formed on a surface of the bright layer, parts of the top coat layer being in close contact with the base portion through the openings of the bright layer.

The first aspect of the radar cover may include a transparent layer including a fitted portion, wherein a fitting portion fitted to the fitted portion and being visible from the outside of the vehicle through the transparent layer is configured of the base portion, the bright layer and the top coat layer, and is disposed such that the top coat layer faces an inner wall surface of the fitted portion.

The first aspect of the radar cover may include a support member fixed to the transparent layer and supporting a side of the fitting portion opposite to the transparent layer, wherein the support member includes a pedestal portion with which the fitting portion is in contact.

A second aspect of the present invention is a method of manufacturing a radar cover for covering a radar unit which detects a situation around a vehicle, including: a bright layer formation step of forming a bright layer on a surface of a base portion serving as a frame, the bright layer being a discontinuous metal layer having openings penetrating therethrough in a layer thickness direction; and a top coat layer formation step of forming a transparent top coat layer on a surface of the bright layer such that parts of the top coat layer are in close contact with the base portion through the openings of the bright layer.

According to the above-described aspects of the present invention, since the top coat layer is in close contact with the base portion through the openings of the bright layer, the bright layer is sandwiched between the top coat layer and the base portion, and therefore the bright layer is fixed to the base portion. Therefore, it is possible to hold the bright layer without forming the base coat layer. Therefore, according to the aspects of the present invention, since the radar cover does not have a base coat layer between the base portion and the bright layer which have been conventionally provided, it is not necessary to perform a process of forming the base coat layer. Therefore, according to the aspects of the present invention, it is possible to simplify a manufacturing process in a radar cover having a bright layer that can transmit electromagnetic waves.

DETAILED DESCRIPTION

Hereinafter, a radar cover and a method of manufacturing the radar cover according to one embodiment of the present invention will be described with reference to the accompanying drawings. In the following drawings, the scale of each member will be appropriately changed in order for each member to have a recognizable size.

Figure 1:
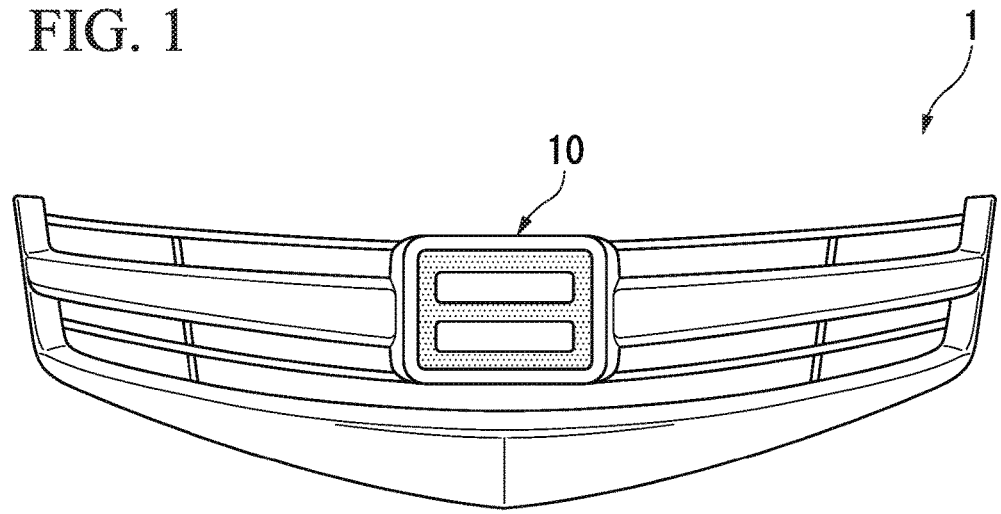
FIG. 1 is a front view of a radiator grille having an emblem according to one embodiment of the present invention.
Figure 2:
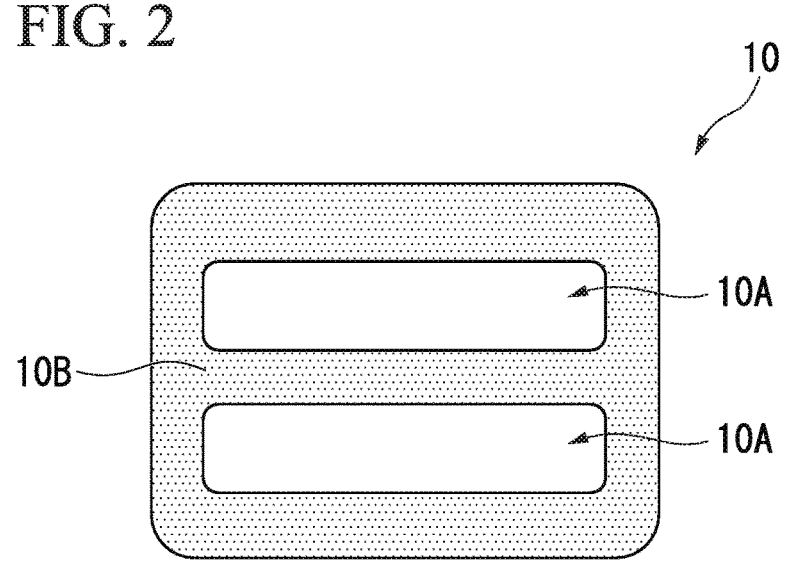
FIG. 2 is an enlarged front view of the emblem according to one embodiment of the present invention.
Figure 3A:
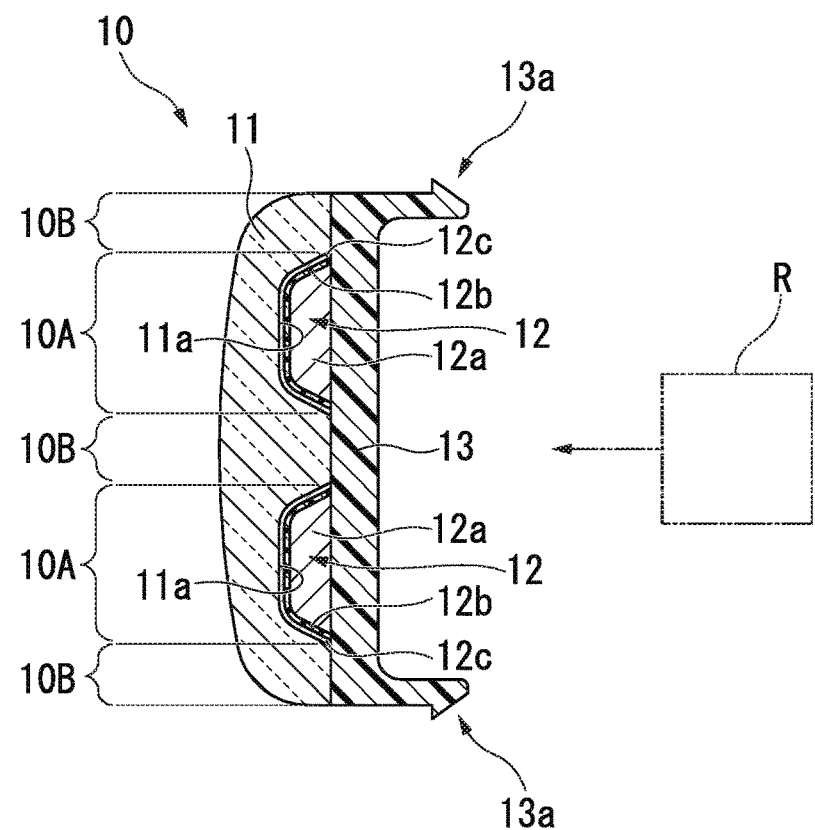
FIG. 3A is a cross-sectional view of the emblem according to one embodiment of the present invention.
Figure 3B:
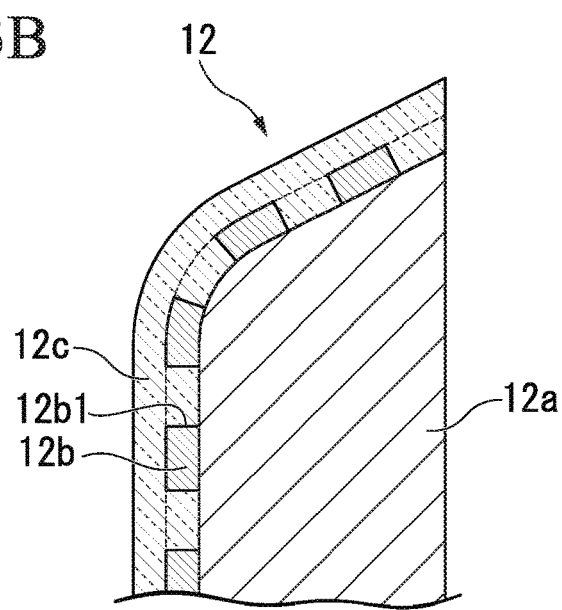
FIG. 3B is a partially enlarged cross-sectional view of an inner emblem included in the emblem according to one embodiment of the present invention.

FIG. 1 is a front view of a radiator grille 1 having an emblem 10 formed of a radar cover of the present embodiment. FIG. 2 is an enlarged front view of the emblem 10 of the present embodiment. FIG. 3A is a cross-sectional view of the emblem 10 of the present embodiment, and FIG. 3B is a partially enlarged cross-sectional view of an inner emblem 12 included in the emblem 10 of the present embodiment.

The radiator grille 1 is provided on a front surface of a vehicle to close an opening that communicates with an engine room of a vehicle to ensure ventilation to the engine room and to prevent foreign matter from entering the engine room. At a center of the radiator grille 1, the emblem 10 is provided to face a radar unit R (see FIG. 3A) disposed in the engine room. The radar unit R includes, for example, a transmitter that transmits millimeter waves, a receiver that receives reflected waves, a calculator that performs a calculation process, and the like. The radar unit R transmits and receives electromagnetic waves through the emblem 10 and detects a surrounding condition of the vehicle on the basis of the received electromagnetic waves. The radar unit R calculates and outputs a distance to an obstacle, a relative speed of the obstacle, or the like, for example.

The emblem 10 is disposed to cover the radar unit R when viewed from a front side of the vehicle. When viewed from the front side of the vehicle as illustrated in FIG. 2, the emblem 10 is a component which includes a bright region 10A which represents a figure, a character, or the like indicating an emblem of a vehicle manufacturer, and a black region 10B which improves visibility of the bright region 10A. As illustrated in FIG. 3A, the emblem 10 as above includes a transparent member 11 (a transparent layer), an inner emblem 12 (a fitting portion), and a base member 13 (a support member).

The transparent member 11 is a portion formed of a substantially rectangular transparent material (including colored transparency) disposed at the outermost side of the vehicle. In order to enhance visibility of the inner emblem 12 when viewed from the outside of the vehicle, a surface of the front side of the transparent member 11 is formed in a smooth surface. Also, a recessed portion 11a (a fitted portion) in which the inner emblem 12 is disposed is formed on a surface of a back side of the transparent member 11. Also, a region of the surface of the back side of the transparent member 11 in which the recessed portion 11a is not provided is a fixing surface fixed to the base member 13.

The recessed portion 11a is a portion to which the inner emblem 12 is fitted and allows the inner emblem 12 accommodated therein to be three-dimensionally visible from the front side of the vehicle. The recessed portion 11a is provided according to a shape of a figure, a character, or the like of an emblem or the like of a vehicle manufacturer. When the inner emblem 12 is accommodated in the recessed portion 11a, the bright region 10A described above is formed.

The transparent member 11 is formed of a transparent synthetic resin such as a colorless polycarbonate (PC) or a poly methyl methacrylate resin (PMMA) and has a thickness of about 1.5 mm to 10 mm. In addition, a hard coat treatment for preventing scratches or a clear coat treatment using a urethane-based coating material and the like is applied as needed to the surface of the front side of the transparent member 11. Further, these scratch prevention treatments are unnecessary if the material of the transparent member 11 is the transparent synthetic resin having scratch resistance.

As illustrated in FIG. 3B, the inner emblem 12 includes a base portion 12a, a bright layer 12b, and a top coat layer 12c. The base portion 12a is a rigid member serving as a frame of the inner emblem 12 and supports the bright layer 12b and the top coat layer 12c. The base portion 12a is formed through injection molding or the like and is formed of a synthetic resin such as acrylonitrile-butadiene-styrene (ABS), PC, or polyethylene terephthalate (PET). The base portion 12a has a convex shape to fill the recessed portion 11a of the transparent member 11 and is fitted to the recessed portion 11a of the transparent member 11.

The bright layer 12b is formed on the surface of the front side of the base portion 12a (the surface on the transparent member 11 side, the surface closer to the transparent member 11) and is a layer having metallic brilliance disposed to cover the base portion 12a. The bright layer 12b is a metallic thin layer formed of indium (In) or aluminum (Al). As illustrated in FIG. 3B, the bright layer 12b is a discontinuous layer having a structure formed of islands and having a large number of fine openings 12b1 penetrating therethrough in a layer thickness direction, and the bright layer 12b is configured to allow electromagnetic waves to pass through the openings 12b1. Although an actual width of the openings 12b1 is very small, the width in the drawing is enlarged for easier viewing. The bright layer 12b is formed through, for example, a sputtering method. The bright layer 12b in the present embodiment is directly formed on the surface of the base portion 12a serving as a frame. That is, in the present embodiment, another layer such as a base coat layer is not provided between the base portion 12a and the bright layer 12b.

The top coat layer 12c is a transparent (including colored transparency) resin layer formed of clear coating or the like, for example, and has electromagnetic wave transmissibility. As illustrated in FIG. 3B, the top coat layer 12c is formed on the surface of the bright layer 12b (the surface opposite to the base portion 12a), and parts of the top coat layer 12c are in close contact with the base portion 12a through the openings 12b1 of the bright layer 12b. The top coat layer 12c covers the bright layer 12b to protect the bright layer 12b from moisture or the like and holds the bright layer 12b such that the bright layer 12b does not peel off from the base portion 12a. That is, the bright layer 12b is supported by the top coat layer 12c and is firmly fixed to the base portion 12a.

Referring to FIG. 3A again, the base member 13 is a portion fixed to a back side of the transparent member 11 and is formed of a black resin material. The base member 13 functions as a support member which supports the inner emblem 12 from a side opposite to the transparent member 11 while being fixed to the transparent member 11. In addition, the base member 13 includes an engaging portion 13a protruding toward the engine room side.

A tip portion of the engaging portion 13a is formed in a claw shape and the tip portion engages with a radiator grille main body, for example. The base member 13 fixed to the surface of the back side of the transparent member 11 as described above is visible from the outside of the transparent member 11 and forms the black region 10B described above. The base member 13 causes a region of the emblem 10 other than the bright region 10A to appear black and thus relatively improves visibility of the bright region 10A.

Such a base member 13 is formed of a synthetic resin such as an acrylonitrile-butadiene-styrene (ABS) copolymerization synthetic resin, an acrylonitrile-ethylene-styrene (AES) copolymerization synthetic resin, acrylonitrile-styrene-acrylate (ASA), polybutylene terephthalate (PBT), colored PC, and polyethylene terephthalate (PET), or a composite resin thereof, and has a thickness of about 0.5 mm to 10 mm.

Next, a method of manufacturing the emblem 10 of the present embodiment will be described with reference to FIG. 4.

Figure 4:
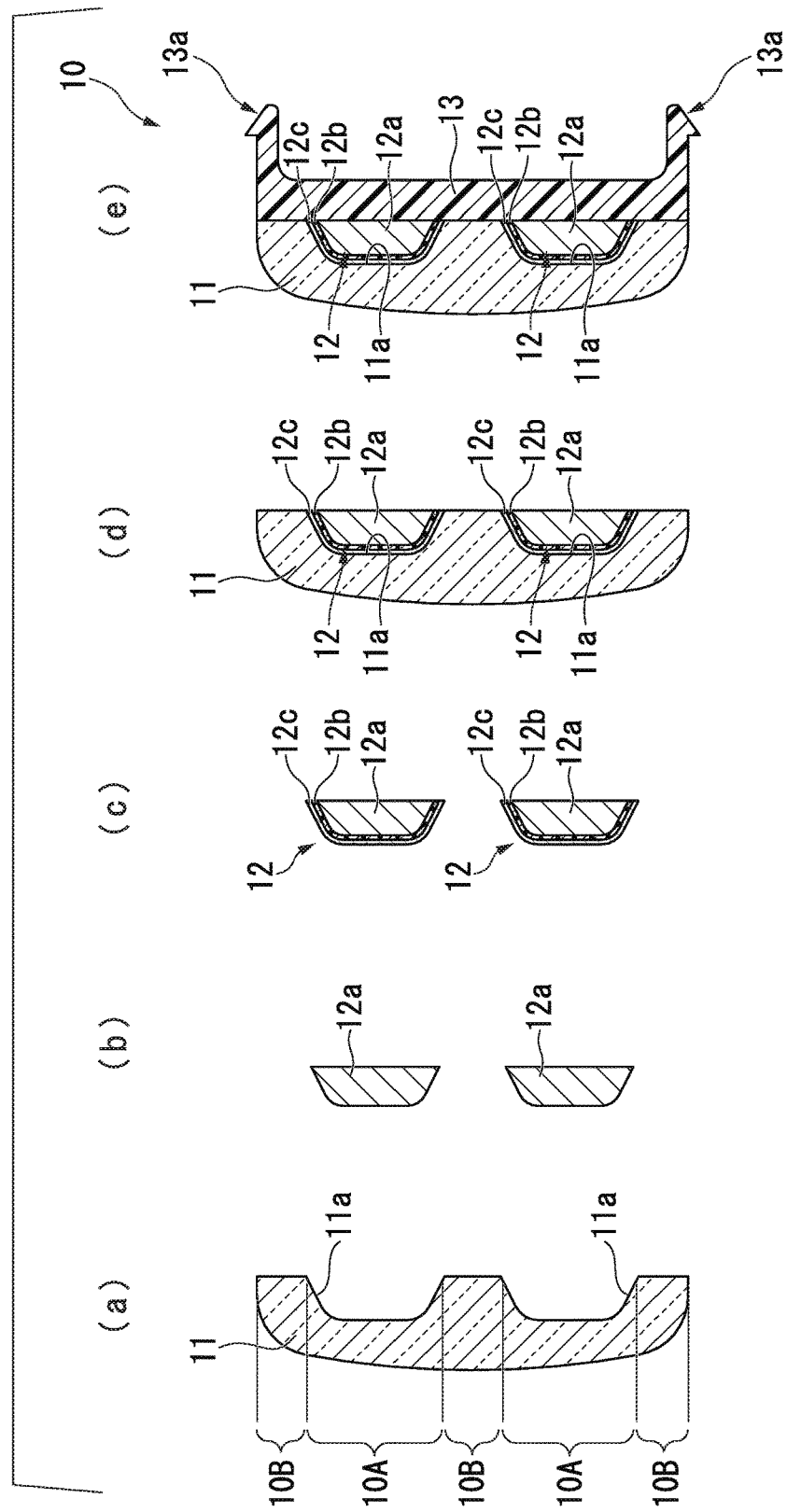
FIG. 4 is a schematic view for describing a method of manufacturing the emblem according to one embodiment of the present invention.

FIG. 4 is a schematic view for describing the method of manufacturing the emblem 10 of the present embodiment.

First, the transparent member 11 is formed as illustrated in FIG. 4(a). For example, the transparent member 11 is formed by injection molding. Since the transparent member 11 having the recessed portion 11a can be formed by the injection molding, it is not necessary to form the recessed portion 11a by a subsequent process. Further, a hard coat treatment for improving durability or the like may be applied as needed to a surface side (a surface facing a vehicle outer side) or an entire surface of the transparent member 11.

Next, the base portion 12a of the inner emblem 12 is formed as illustrated in FIG. 4(b). For example, the base portion 12a is formed by injection molding. Next, the bright layer 12b is formed on the surface of the base portion 12a and the top coat layer 12c is formed as illustrated in FIG. 4(c). Here, a process of forming the bright layer 12b corresponds to a bright layer formation step of the present invention. In addition, a process of forming the top coat layer 12c corresponds to a top coat layer formation step of the present invention.

The bright layer 12b is formed in a vacuum atmosphere inside a vacuum chamber, for example, by sputtering. The bright layer 12b formed as described above is formed as a discontinuous layer having a plurality of openings 12b1 due to poor wettability or the like of the base portion 12a.

The top coat layer 12c is formed by coating the bright layer 12b with a clear coating material and then drying the clear coating material. As the clear coating material described above, a material having a solubility parameter close to that of the base portion 12a and having high wettability with respect to the base portion 12a and the bright layer 12b is preferable. Specifically, in a case in which the base portion 12a is formed of PC, it is preferable to use a coating material containing an acrylic resin at 25.5% by mass, methyl methacrylate at 0.5% by mass, toluene at 9.0% by mass, formaldehyde at 0.5% by mass, xylene at 2.0% by mass, ethylbenzene at 0.5% by mass, n-butyl acetate at 22.0% by mass, normal butanol at 34.0% by mass, cyclohexanone at 5.0% by mass, and other additives, an organic solvent, and the like at 1.0% by mass.

The inner emblem 12 is formed by the process of forming the base portion 12a illustrated in FIG. 4(b) and the process of forming the bright layer 12b and the top coat layer 12c illustrated in FIG. 4(c). In addition, it is not necessary to wait for the process of forming the transparent member 11 illustrated in FIG. 4(a) before performing the process of forming the base portion 12a illustrated in FIG. 4(b) and the process of forming the bright layer 12b and the top coat layer 12c illustrated in FIG. 4(c). It is possible to shorten a manufacturing time of the emblem 10 by forming the inner emblem 12 in parallel with the process of forming the transparent member 11 illustrated in FIG. 4(a).

Next, the inner emblem 12 is fitted into the recessed portion 11a of the transparent member 11 as illustrated in FIG. 4(d). Next, the base member 13 is formed as illustrated in FIG. 4(e). Here, the transparent member 11, in which the inner emblem 12 is installed in the recessed portion 11a, is disposed inside a mold for injection molding and insert molding in which a molten resin is injected to the back surface side of the transparent member 11 is performed to form the base member 13. Such a base member 13 is welded to the transparent member 11 by heat during the insert molding and is disposed to cover the inner emblem 12. Thereby, the bright layer 12b of the inner emblem 12 is fixed to the transparent member 11 together with the base portion 12a in a state in which the bright layer 12b is in direct contact with an inner surface of the recessed portion 11a.

The emblem 10 of the present embodiment is manufactured by the process as described above. According to the method of manufacturing the emblem 10 and the emblem 10 of the present embodiment as described above, since the top coat layer 12c is in close contact with the base portion 12a through the openings 12b1 of the bright layer 12b, the bright layer 12b is fixed to the base portion 12a. Thus, the bright layer 12b can be held without forming a base coat layer. Therefore, according to the method of manufacturing the emblem 10 and the emblem 10 of the present embodiment, the base coat layer which has been conventionally provided between the base portion 12a and the bright layer 12b is not included, and the manufacturing process can be simplified because the process of forming the base coat layer is not necessary.

In addition, the emblem 10 of the present embodiment includes the transparent member 11 having the recessed portion 11a and the inner emblem 12 fitted to the recessed portion 11a and visible from the outside through the transparent member 11, the inner emblem 12 includes the base portion 12a, the bright layer 12b, and the top coat layer 12c, and the top coat layer 12c side of the inner emblem 12 is disposed to face an inner wall surface of the recessed portion 11a. Therefore, it is unnecessary to perform the process of forming the base coat layer and the inner emblem 12 can be formed in a short time. Therefore, it is possible to manufacture the emblem 10 in a shorter time by forming the transparent member 11 and the inner emblem 12 in parallel.

Figure 5A:
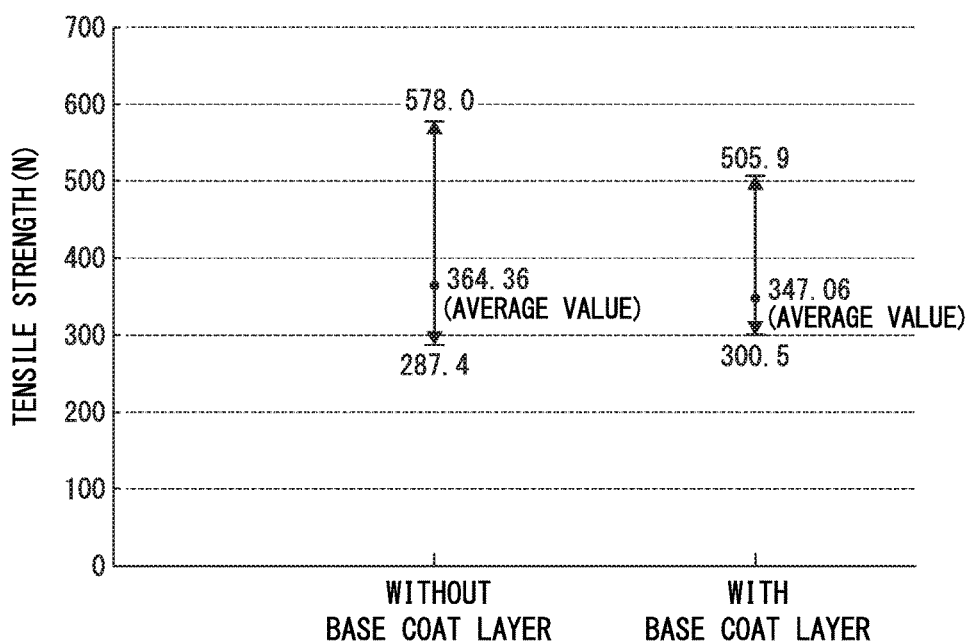
FIG. 5A is a figure in which tensile strength of a top coat layer is compared between a case in which there is no base coat layer and a case in which there is a base coat layer.

Further, adhesion of the top coat layer 12c in the emblem 10 of the present embodiment is the same as compared to a case in which the base coat is provided. FIG. 5A is a figure in which tensile strength of a top coat layer is compared between a case in which there is no base coat layer (the emblem of the present embodiment) and a case in which there is a base coat layer (a conventional emblem). As illustrated in FIG. 5A, the tensile strength of the emblem 10 of the present embodiment was 364.36 N on average in the range of 287.4 N to 578.0 N while the tensile strength of the conventional emblem was 347.06 N on average in the range of 300.5 N to 505.9 N. Since the tensile strength of the top coat layer 12c is considered to be sufficient at about 200 N, it is confirmed that the adhesion of the top coat layer 12c in the emblem 10 of the present embodiment is the same as compared to the case in which the base coat layer is provided.

Figure 5B:
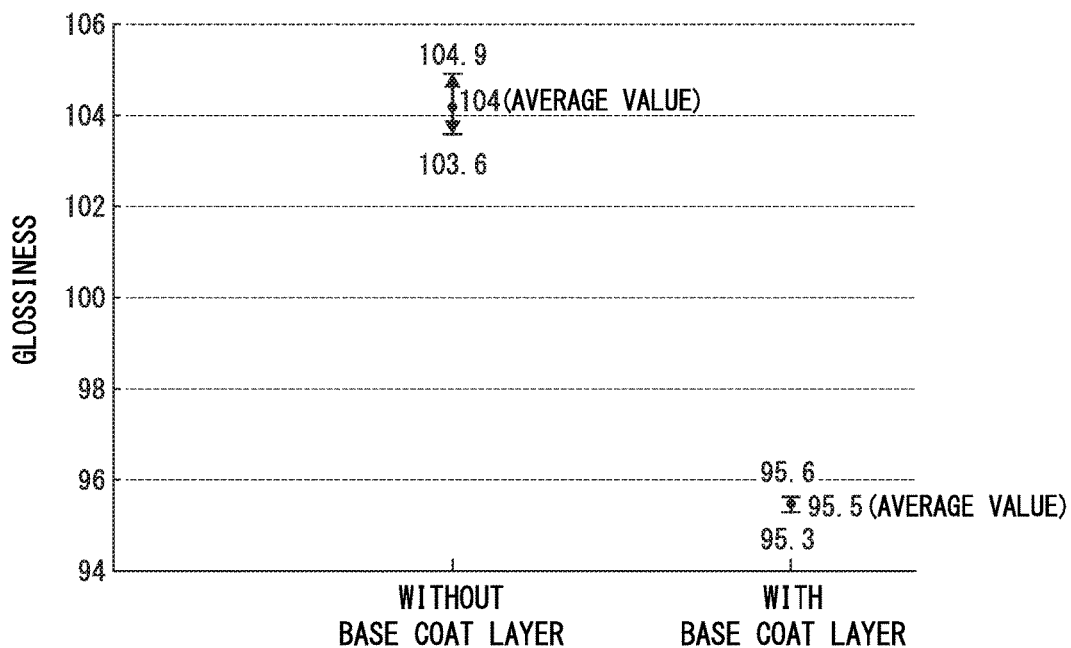
FIG. 5B is a figure in which surface glossiness is compared between a case in which there is no base coat layer and a case in which there is a base coat layer.

In addition, smoothness of the top coat layer 12c in the emblem 10 of the present embodiment is equal to or greater than in the case in which the base coat layer is provided. FIG. 5B is a figure in which surface glossiness is compared between the case in which there is no base coat layer (the emblem of the present embodiment) and the case in which there is a base coat layer (a conventional emblem). When the glossiness is high, it is considered that specular reflectance of an external layer is high and the smoothness is high. As illustrated in FIG. 5B, the glossiness in the emblem 10 of the present embodiment was 104 on average in the range of 103.6 to 104.9 while the glossiness in the conventional emblem was 95.5 on average in the range of 95.3 to 95.6. In other words, it is confirmed that the smoothness of the top coat layer 12c in the emblem 10 of the present embodiment is equal to or greater than in the case in which the base coat layer is provided.

Although preferred embodiments of the present invention have been described above with reference to the accompanying drawings, the present invention is not limited to the above embodiments as a matter of course. The shapes, combinations, or the like of each constituent member illustrated in the embodiments described above are merely examples, and various modifications can be made on the basis of design requirements within the scope not departing from the spirit of the present invention.

For example, in the embodiment described above, the configuration in which the inner emblem 12 includes the base portion 12a, the bright layer 12b, and the top coat layer 12c has been described. However, the present invention is not limited thereto. For example, a structure may be adopted in which the emblem itself includes a base portion which serves as a frame, a bright layer which is formed on a surface of the base portion and is a discontinuous metal layer having openings penetrating therethrough in a layer thickness direction, and a transparent top coat layer formed on a surface of the bright layer, parts of the top coat layer being in close contact with the base portion through the openings of the bright layer.

Figure 6:
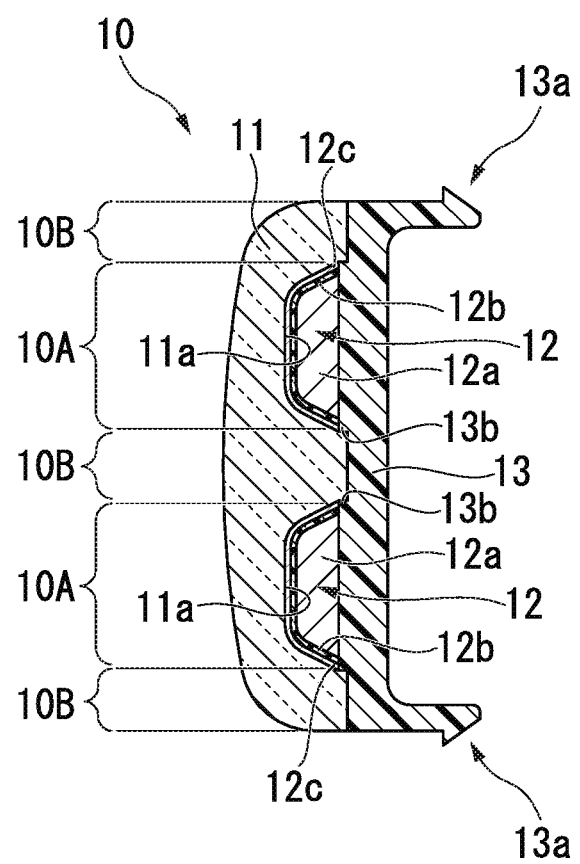
FIG. 6 is a cross-sectional view illustrating a modified example of the emblem according to one embodiment of the present invention.

In addition, in the embodiment described above, the configuration in which, in the base member 13 functioning as a support member for supporting the inner emblem 12, the surface on which the inner emblem 12 is in contact with the base member 13 is a plane including the region which is not in contact with the inner emblem 12 has been described. However, the present invention is not limited thereto. For example, as illustrated in FIG. 6, a pedestal portion 13b which protrudes toward the transparent member 11 more than a surrounding region may be formed in the region of the base member 13 with which the inner emblem 12 is in contact. By employing such a configuration, the inner emblem 12 can reliably come in contact with the base member 13 even when the thickness of the inner emblem 12 is reduced to the extent to which the base coat layer is absent, and thus the inner emblem 12 can be reliably supported.

The invention claimed is:

1. A radar cover for covering a radar unit which detects a situation around a vehicle, comprising:
   a base portion having a convex shape;
   a bright layer which is formed on whole of a convex-side surface of the base portion and is a discontinuous metal layer having openings penetrating therethrough in a layer thickness direction; and
   a transparent top coat layer formed on whole of the bright layer, parts of the top coat layer in close contact with the convex-side surface of the base portion through the openings of the bright layer.

2. The radar cover according to claim 1, comprising:
   a transparent layer including a fitted portion having a recessed shape; and
   a fitting portion fitted to the fitted portion and visible from the outside of the vehicle through the transparent layer, wherein
   the fitting portion configured of the base portion, the bright layer and the top coat layer, and
   the top coat layer, the bright layer, and the base portion are disposed inside the fitted portion such that the top coat layer contacts with an inner wall surface of the fitted portion.

3. The radar cover according to claim 2, comprising:
   a support member fixed to the transparent layer and contacting with the fitting portion, the support member supporting the fitting portion so as to sandwich the fitting portion by the supporter and the transparent layer, wherein
   the support member includes a pedestal portion with which the fitting portion is in contact.

4. The radar cover according to claim 3, wherein
   the pedestal portion is formed such that a region where the support member is in contact with the fitting portion protrudes toward the transparent member more than a surrounding region of the pedestal portion.

5. The radar cover according to claim 1, wherein
   the openings of the bright layer are invisible small holes.

6. A method of manufacturing a radar cover for covering a radar unit which detects a situation around a vehicle, comprising:
   a bright layer formation step of forming a bright layer on a surface of a base portion having a convex shape, wherein the bright layer is a discontinuous metal layer having openings penetrating therethrough in a layer thickness direction; and
   a top coat layer formation step of forming a transparent top coat layer on whole of the bright layer such that parts of the top coat layer are in close contact with the convex-side surface of the base portion through the openings of the bright layer.

* * * * *